United States Patent
Peterson et al.

(10) Patent No.: US 12,340,924 B2
(45) Date of Patent: Jun. 24, 2025

(54) INTEGRATED FLEXIBLE CIRCUIT ATTACHMENT FEATURES WITH SOUND DAMPENING AND METHOD OF FORMING SAID FEATURES

(71) Applicant: Aptiv Technologies AG, Schaffhausen (CH)

(72) Inventors: David R. Peterson, Aurora, OH (US); Joseph Sudik, Jr., Niles, OH (US); Jesse Braun, Bentleyville, OH (US); David Siegfried, Warren, OH (US)

(73) Assignee: Aptiv Technologies AG, Schaffhausen (CH)

( * ) Notice: Subject to any disclaimer, the term of this patent is extended or adjusted under 35 U.S.C. 154(b) by 254 days.

(21) Appl. No.: 18/071,183

(22) Filed: Nov. 29, 2022

(65) Prior Publication Data

US 2023/0178264 A1 Jun. 8, 2023

Related U.S. Application Data (60) Provisional application No. 63/285,281, filed on Dec. 2, 2021, provisional application No. 63/285,277, filed on Dec. 2, 2021.

(51) Int. Cl.
*H01B 7/08* (2006.01)
*H01B 19/02* (2006.01)
*H01B 19/04* (2006.01)

(52) U.S. Cl.
CPC ........... *H01B 7/0823* (2013.01); *H01B 19/02* (2013.01); *H01B 19/04* (2013.01)

(58) Field of Classification Search
CPC ........ H05K 1/116; H05K 3/0058; H05K 3/28; H05K 7/14; H01B 7/08
USPC ............. 174/250–252, 117 R, 117 F, 117 FF
See application file for complete search history.

(56) References Cited

U.S. PATENT DOCUMENTS

2008/0081125 A1 * 4/2008 Jung .................... H05K 3/0091
427/553

FOREIGN PATENT DOCUMENTS

| EP | 3054752 A1 * | 8/2016 | ............... H05K 3/28 |
| EP | 3840550 A1 | 6/2021 | |
| JP | H11-54963 A * | 2/1999 | ............... H05K 7/14 |
| JP | 2007123780 A | 5/2007 | |

OTHER PUBLICATIONS

"Extended European Search Report Received mailed on May 4, 2023", 8 Pages.

\* cited by examiner

*Primary Examiner* — William H. Mayo, III
(74) *Attorney, Agent, or Firm* — Billion & Armitage (57) ABSTRACT

A wiring assembly including a flex circuit including a plastic laminate layer and a mount location configured to receive a fastener secured to a substrate. The wiring assembly further includes a flex circuit attachment feature, the flex circuit attachment feature including an extruded material bonded to the plastic laminate layer at the mount location.

19 Claims, 11 Drawing Sheets

INTEGRATED FLEXIBLE CIRCUIT ATTACHMENT FEATURES WITH SOUND DAMPENING AND METHOD OF FORMING SAID FEATURES

CROSS-REFERENCE TO RELATED APPLICATION

This application claims benefit of U.S. Provisional Application No. 63/285,277 filed on Dec. 2, 2021, and U.S. Provisional Application No. 63/285,281 filed on Dec. 2, 2021, the entire contents of each of which are incorporated herein by reference. A claim of priority is made.

BACKGROUND

An electrical flex circuit is a type of electronic circuit or other conductor arrangement disposed on a flexible plastic substrate (e.g., polyimide, polyether ether ketone, polyethylene terephthalate, or other transparent conductive polyester film). Flex circuits may be advantageous in applications where the assembly is required to flex during use, applications where space constraints are important, and/or electrical connections between sub-assemblies to replace wire harnesses, which generally weight more and take-up more space than flex circuits.

One limitation of flex circuits is the increased risks of damage during assembly or use, as compared to wire harnesses or inflexible circuits. Flex circuits may wear more rapidly than round wire harnesses or inflexible circuits, due to other components contacting the flex circuit, high-stress flexing of flex circuit, or stress at mounting and/or connection points of the flex circuit. Such wear and deterioration may contribute to electrical noise (i.e., an unwanted disturbance in an electrical signal) through the flex circuit. High-stress flexing of the flex circuit may also contribute to electrical noise even if the flex circuit is not damaged or worn.

SUMMARY

According to one or more embodiments of the present disclosure, a flexible circuit including a flexible flat cable including a first surface and a second surface, the first surface diametrically opposed from the second surface. The flex circuit further includes an extruded material bonded to the first surface of the flexible flat cable; the extruded material distributed in a pattern on the first surface of the flexible flat cable.

According to one or more embodiments of the present disclosure, a method of forming a flex circuit. The method includes providing a flexible flat cable including a first surface and a second surface, the first surface diametrically opposed to the second surface. The method further includes providing a dispensing apparatus including a nozzle and dispensing an extruded material through the nozzle onto the first surface of the flexible flat cable. The method comprises shaping the extruded material into a pattern and curing the extruded material onto the first surface of the flexible flat cable.

According to one or more embodiments of the present disclosure, a method of providing abrasion resistance to a flex circuit. The method includes aerosolizing a material comprising a urethane acrylate oligomer and a photo-initiator compound, providing a pattern element, and projecting the material on the flex circuit. The pattern element is configured to shape the material into a pattern and the material configured to provide an abrasion resistance to the flex circuit. The method may further include curing the material on the flex circuit and aligning a flexible flat cable on a shaper, the shaper having a surface defining a desired shape.

BRIEF DESCRIPTION OF DRAWINGS

This written disclosure describes illustrative embodiments that are non-limiting and non-exhaustive. Reference is made to illustrative embodiments that are depicted in the figures, in which.

DETAILED DESCRIPTION

According to one or more embodiments of the present disclosure, an extruded material coating (i.e., a surface protectant) may be selectively applied to an electrical flex circuit or other flexible conductor arrangement in order to provide abrasion resistance and noise abatement as necessary for a vehicle or other applications. The coating may be selectively applied to create channels, ribs, ridges, or other structural features to add protection to high-wear areas, to promote routing control in assembly and use, and/or to provide structural support at connection points or mounting points.

In some embodiments, the extruded material may be applied to a surface of the flex circuit via a fused disposition modeling ("FDM") or 3D printing process, wherein the coating is pushed through an extruder and deposited on the surface of the flex circuit. The FDM or 3D printing process may deposit various layers and patterns of the coating on the surface of the flex circuit and may be customized for various flex circuit applications. In some embodiments, the coating may be applied to the surface of the flex circuit via a spray-on process, wherein the coating is aerosolized and projected onto the surface of the flex circuit. In some embodiments, the coating may be applied to the surface of the flex circuit via a direct surface contact, wherein a pre-formed (or pre-shaped) coating is applied to the surface of the flex circuit. Various dispensing tools (e.g., nozzles, applicators, printers, etc.) may be used to apply the coating. The thickness, number of layers, pattern, etc., may be adjusted for different flex circuit applications.

In some embodiments, digitally controlled dispensing methods may be used to apply the coating to the flex circuit. Digitally controlled dispensing methods provide an infinite number of patterns, thereby optimizing desired results while minimizing processing time and material. Different models of automatic material dispensing equipment configurations exist that may be suitable for this type of application, including a base/stand, a programable process controller, a human/machine interface (HMI), a multi axis robot arm, a material reservoir, a temperature controller, a pump/mixer, an application nozzle, a lighting source, and a vision system.

Figure 1:
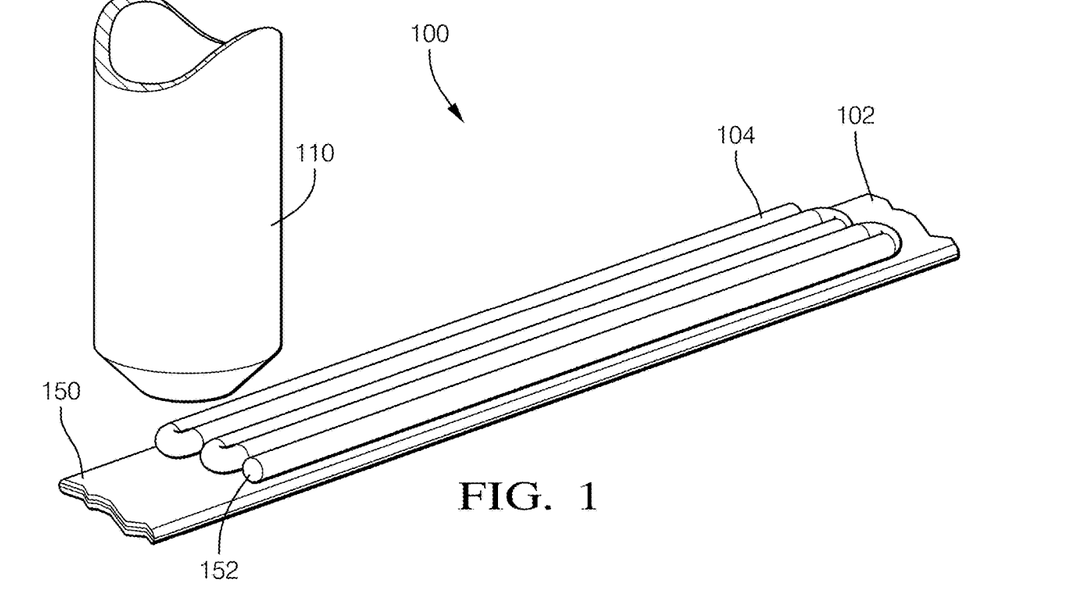
FIG. 1 illustrates an isometric view of an extruded material dispensed on a flexible circuit with an application nozzle, according to some embodiments.

FIG. 1 illustrates an isometric view of an extruded material 104 dispensed on a flexible flat cable 102 of a flex circuit 100 with a nozzle 110. The flexible flat cable 102 includes a first surface 150 and a second surface (not shown) diametrically opposite to the first surface 150. The first surface 150 may include a flexible plastic substrate material, including but not limited to polyimide, polyether ether ketone, polyethylene terephthalate, or other transparent conductive polyester film. The first surface 150 and the second surface may encapsulate a conductor layer, e.g., copper strips, metal or conductive (metal filled) polymer, flexible dielectric film, etc. In some embodiments, the flex circuit 100 may include two or more conductor layers, i.e., the flex circuit 100 may include a double-sided flex circuit or multi-layer flex circuit.

In some embodiments, the extruded material 104 may be formed from the chemical class acrylate urethane (including urethane acrylate oligomers) of a moderate to high viscosity and may exhibit thixotropic properties. The viscosity and thixotropy of the extruded material 104 may be configured to allow for precision dispensing of dimensionally stable structures (e.g., beads, channels, ribs, ridges, etc.). Or in other words, the extruded material 104 (or "dispensate") will not run, flow, or otherwise lose shape. As illustrated in FIG. 1, a cross section 152 of the extruded material 104 may be shaped by the nozzle 110.

In some embodiments, the extruded material 104 may include a photo-initiator to enable a photopolymerization cure mechanism. An application of ultraviolet (UV) and/or visible light (VV) may follow the application of the coating to cure (i.e., to catalyze chemical/molecular structures) the extruded material 104. In some embodiments, the extruded material 104 may include a fluorescent agent to enable easy identification of the dispensate presence, pattern, and/or cure state. The extruded material 104 may exhibit ductile properties to flex/bend with the flex circuit, while providing hardness, stiffness, and durability necessary for abrasion resistance and noise abatement. The extruded material 104 may be configured to bond or adhere with the flex circuit surface, i.e., polyethylene terephthalate (PET), polyethylene naphtholate (PEN), or other engineered plastic laminate layer. The extruded material 104 may also be bonded or adhered to other support structures, such as a thermoplastic molded channel or ridge to provide a strong interfacial connection.

In some embodiments, the nozzle 110 may be configured to travel relative to the flex circuit 100. In other words, the nozzle 110 may move over the surface of the flex circuit 100 and dispense the extruded material 104 onto the flex circuit 100. In some embodiments, the flex circuit 100 may travel relative to the nozzle 110, i.e., the flex circuit 100 moves as the extruded material 104 is dispensed from the nozzle 110 to distribute the extruded material 104 over the flex circuit 100. Movement of the nozzle 110 relative to the flex circuit 100, or vice-versa, may distribute the extruded material 104 over the first surface 150 of the flex circuit 100. In some embodiments, the extruded material 104 may be distributed on the flex circuit 100 to create a pattern, coating, or design configured to provide abrasion resistance, sound dampening, stiffness, rigidity, and/or other structural properties to the flex circuit 100.

Figure 2:
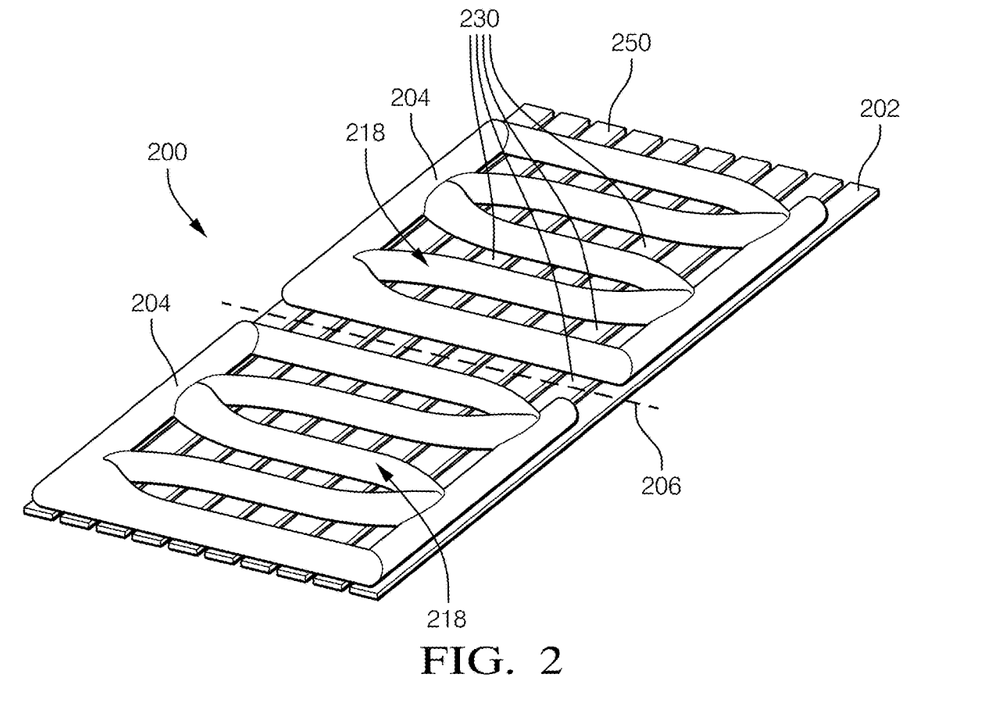
FIG. 2 illustrates an isometric view of an extruded material pattern for abrasion resistance and noise abatement on a flexible circuit, according to some embodiments.

FIG. 2 illustrates an exemplary extruded material pattern on a flex circuit 200, according to some embodiments. The flex circuit 200 includes a flexible flat cable 202 with an extruded material 204 disposed on a first surface 250. The extruded material 204 is distributed in an exemplary double wave pattern 218. The double wave pattern 218 may include a first bead of extruded material 204 arranged in a first wave with a second bead of extruded material 204 arranged in a second wave offset from the first wave. The double wave pattern 218 may include a plurality of uncoated regions 230, or regions on the first surface 250 where no extruded material is present.

In some embodiments, the plurality of uncoated regions 230 may form a fold region 206 configured to guide a direction of a fold or bend of the flexible circuit 200. A fold region 206 may be formed by creating a first area having less rigidity relative to a second area, such that when a force is applied to the first area and the second area, the first area folds or bends. For instance, FIG. 2 illustrates the flex circuit 200 with the double wave pattern 218 separated from the adjacent double wave pattern 218 by a fold region 206. The double wave pattern regions of the flex circuit 200 have increased rigidity and stiffness from the extruded material 204 bonded to the first surface 250. Thus, if a force is applied to the first surface 250, the fold region 206 will bend, whereas the double wave pattern 218 will resist bending and/or transfer the tensile or compression force to the fold region 206.

FIG. 2 illustrates the extruded material 204 disposed on the first surface 250. In some embodiments, the extruded material 204 may be disposed on a second surface (not shown) diametrically opposed to the first surface 250, i.e., the opposite side from the first surface 250 of the flexible flat cable 202. In some embodiments, the extruded material 204 may be distributed in the same pattern on both the first surface 250 and the second surface. In other embodiments, the extruded material may be distributed in a different pattern on the first surface 250 and the second surface.

Figure 3:
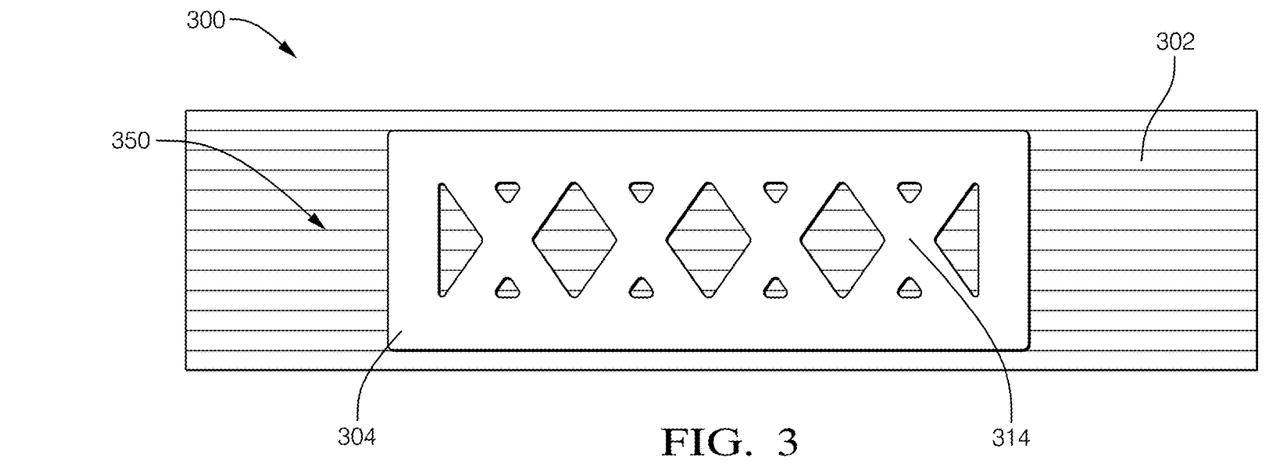
FIG. 3 illustrates a top view of an extruded material in a stiff reinforced cross-hatch pattern on a flexible circuit, according to some embodiments.

FIG. 3 illustrates a top view of a flex circuit 300 including a cross-hatch pattern 314, according to some embodiments. The flex circuit 300 includes a flexible flat cable 302 having an extruded material 304 bonded to a first surface 350. The extruded material 304 may be distributed in a cross-hatch pattern 314 configured to increase the rigidity, or resistance to tensile and compressive forces, of the flex circuit 300. In some embodiments, the cross-hatch pattern may be configured to resist a helical twist of the flex circuit 300. The extruded material 304 may provide resistance to abrasion or wear of the flex circuit 300.

Figure 4:
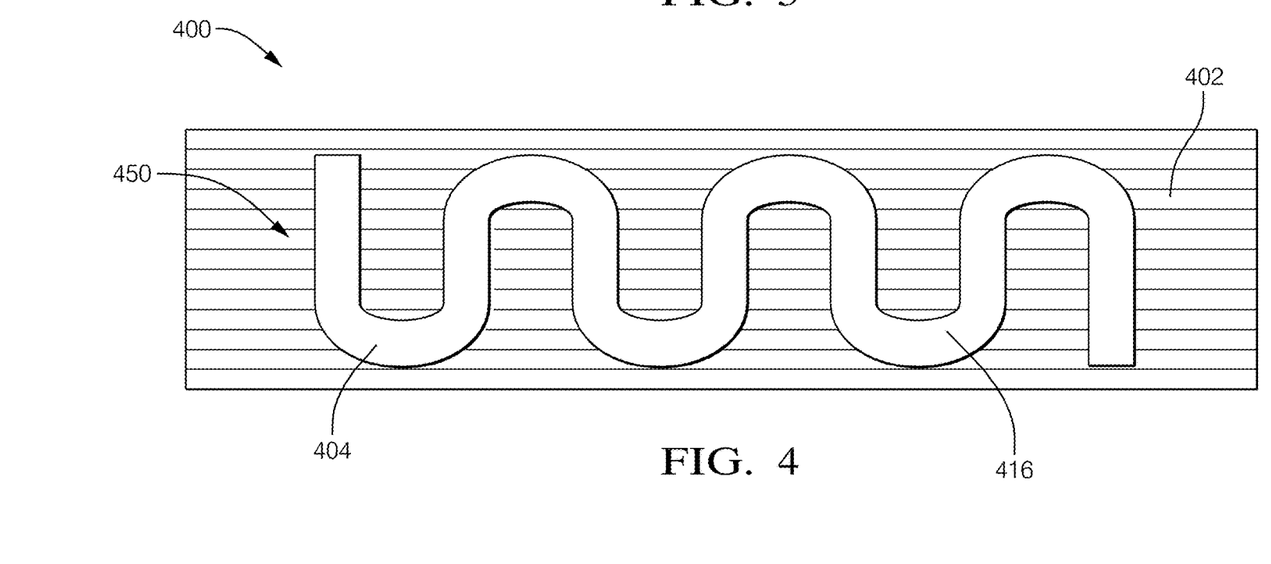
FIG. 4 illustrates a top view of a flex circuit including an extruded material in an abrasion resistant serpentine pattern, according to some embodiments.

FIG. 4 illustrates a top view of a flex circuit 400 with an extruded material 404 distributed in a serpentine pattern 416. The flex circuit 400 includes a flexible flat cable 402 with the extruded material 404 bonded to a first surface 450. The extruded material 404 may be distributed in a serpentine pattern 416 configured to increase the resistance to abrasion of the flex circuit 400. The serpentine pattern 416 may maintain the flexibility of the flex circuit 400 while preventing the flex circuit 400 from being kinked or pinched. The extruded material 404 may provide resistance to abrasion or wear of the flex circuit 400.

Figure 5:
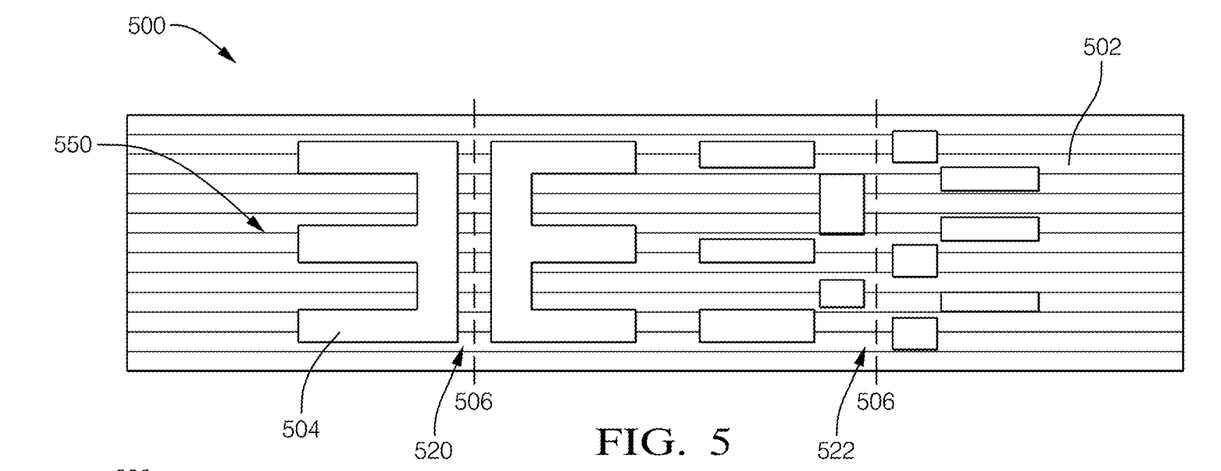
FIG. 5 illustrates a top view of a flex circuit including an extruded material in a directional fold guide pattern, according to some embodiments.

FIG. 5 illustrates a top view of a flex circuit 500 with an extruded material 504 bonded to a first surface 550 of a flexible flat cable 502. The extruded material 504 may be distributed in a pattern including one or more uncoated fold regions 506. The uncoated fold regions may be oriented perpendicular to a longitudinal axis of the flexible flat cable 502. In some embodiments, the flex circuit 500 may include a mirrored pattern 520 wherein a shape or pattern is mirrored over an uncoated fold region 506. In some embodiments, the flex circuit 500 may include a nested mirror pattern 522 wherein a shape or pattern is nested over an uncoated fold region 506. In other words, the nested shape or pattern forms a full shape or pattern when the flex circuit is folded over the uncoated fold region 506. The nested mirror pattern may provide the same structural properties as the mirrored pattern 520 while reducing the amount of extruded material 504 required.

Figure 6:
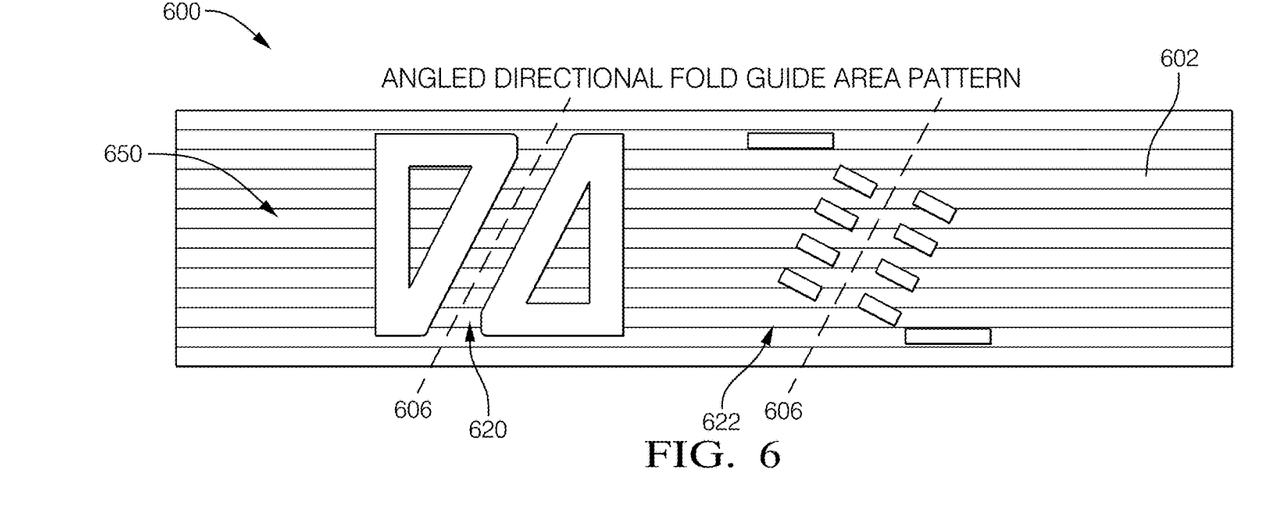
FIG. 6 illustrates a top view of a flex circuit including an extruded material in a directional fold guide pattern, according to some embodiments.

FIG. 6 illustrates a top view of a flex circuit 600 with an extruded material 604 bonded to a first surface 650 of a flexible flat cable 602. The extruded material 604 may be distributed in a pattern including one or more angled uncoated fold regions 606. The angled uncoated fold region 606 may be oriented non-orthogonally to the longitudinal axis of the flexible flat cable 602. In some embodiments, the flex circuit 600 may include a mirrored pattern 620 wherein a shape or pattern is mirrored over an angled uncoated fold region 606. In some embodiments, the flex circuit 600 may include a nested mirror pattern 622 wherein a shape or pattern is nested over an angled uncoated fold region 606.

Figure 7:
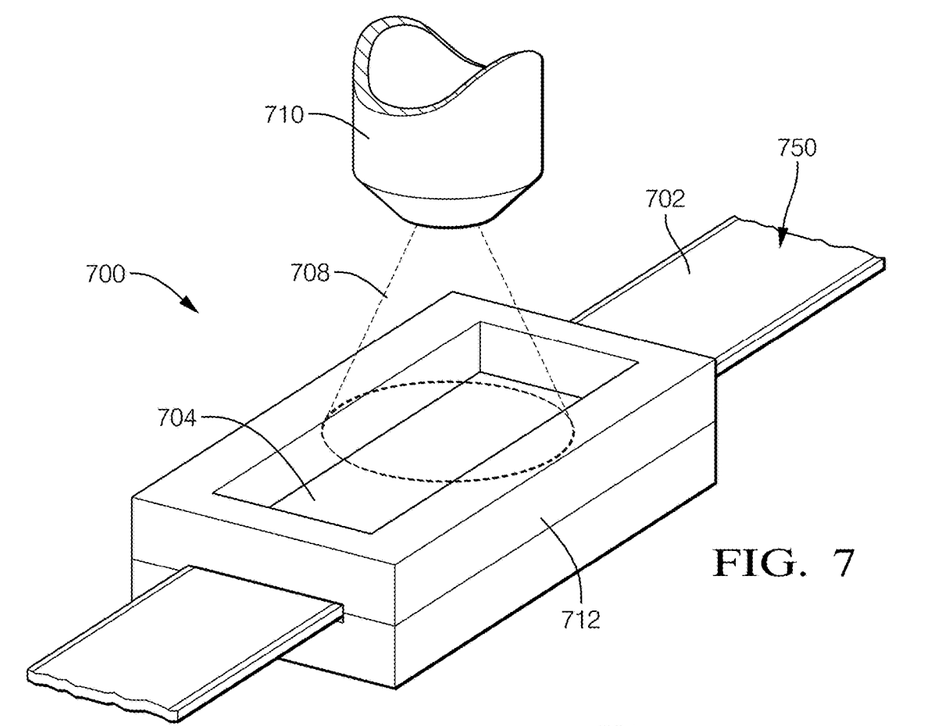
FIG. 7 illustrates an isometric view of an aerosolized material dispensed on a flexible circuit with a spray nozzle, according to some embodiments.
Figure 8:
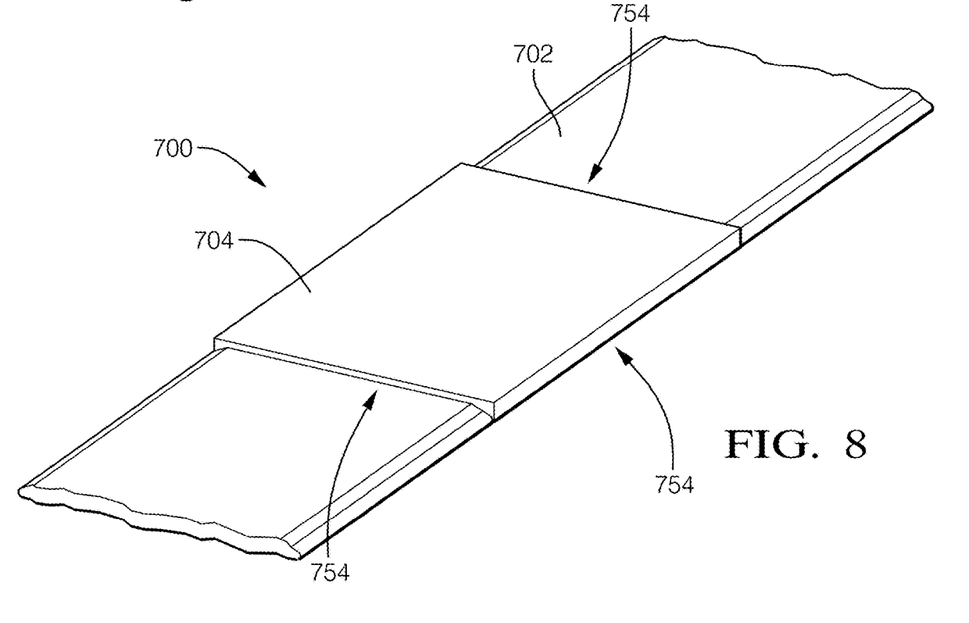
FIG. 8 illustrates an isometric view of a material dispensed on the flexible circuit of FIG. 7, according to some embodiments.

FIG. 7 illustrates an aerosolized material 708 dispensed on a flex circuit 700, according to some embodiments. The flex circuit 700 includes a flexible flat cable 702 having a first surface 750. A nozzle 710 sprays the aerosolized material 708 onto the first surface 750, and optionally, a shaper 712 may be provided to contain a portion of the aerosolized material 708. For instance, the shaper 712 may shield a portion of the first surface 750 from the aerosolized material 708. When the aerosolized material 708 contacts the flex circuit 700, the aerosolized material 708 bonds to the first surface 750 and condenses into an extruded material 704. In other words, once the aerosolized material 708 rests upon the flex circuit 700, the material is no longer suspended in the air, and thus, is no longer aerosolized. The shaper 712 may be configured to create a pattern (e.g., any of the patterns illustrated in FIGS. 3-6), or may be configured to define one or more boundaries of the material 704. For example, FIG. 8 illustrates the boundaries 754 of the extruded material 704 formed by the shaper 712 on the flexible flat cable 702.

The aerosolized material 708 may be formed from the same materials as the extruded material 104. The aerosolized material 708 may be formed form the chemical class acrylate urethane (including urethane acrylate oligomers), may include a photo-initiator to enable a photopolymerization cure mechanism, and may include a fluorescent agent to enable easy identification of the dispensate presence, pattern, and/or cure state. In some embodiments, the aerosolized material 708 comprises the extruded material 104.

Figures 9A, 9B:
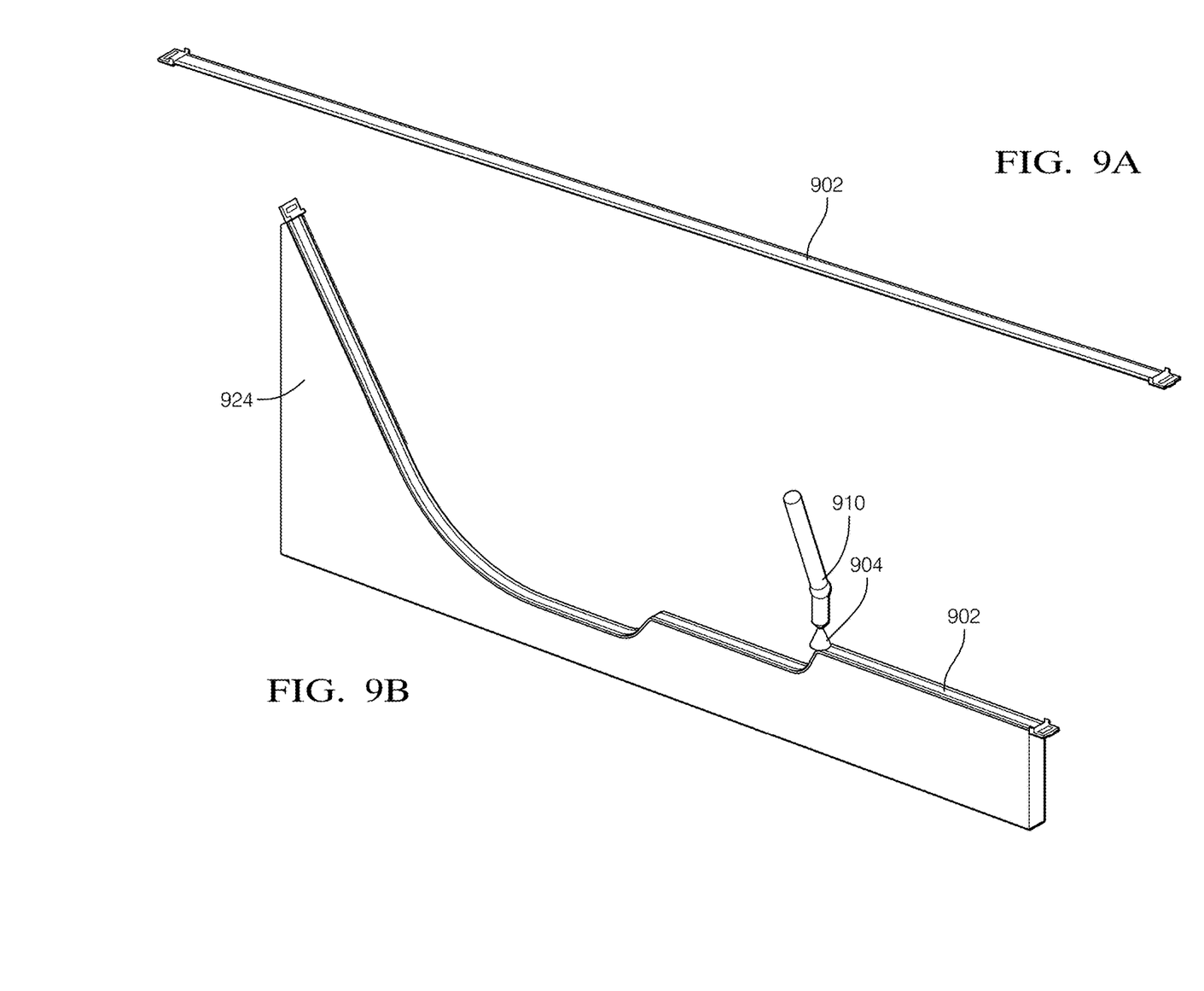
FIG. 9A illustrates an isometric view of an unshaped flex circuit, according to some embodiments.
FIG. 9B illustrates an isometric view of a fixture for selectively applying a coating to the flex circuit of FIG. 9A to maintain a desired shape, according to some embodiments.
Figure 9C:
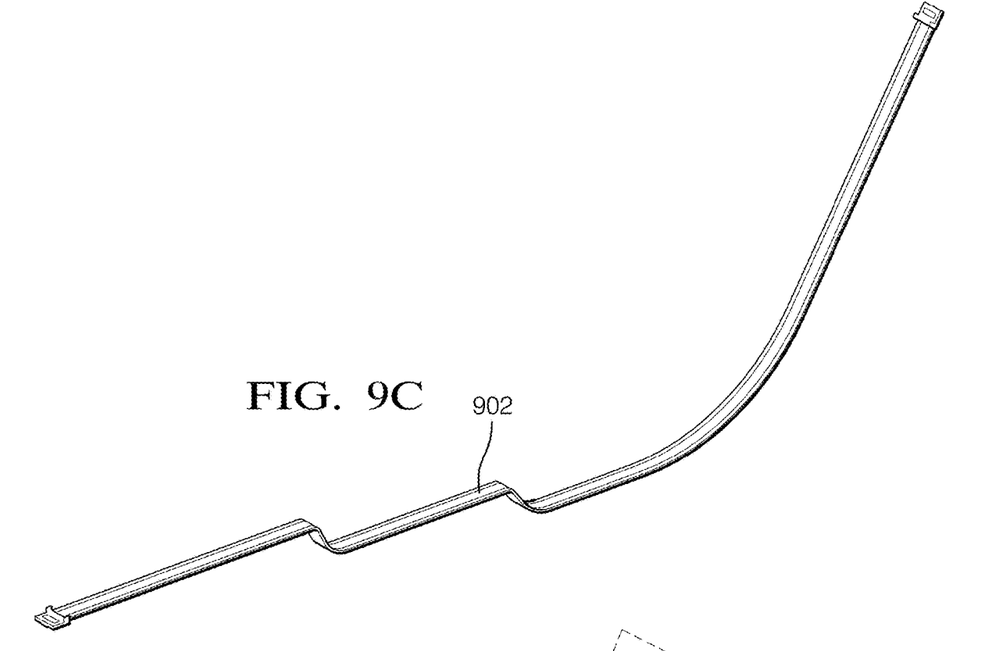
FIG. 9C illustrates an isometric view of a shaped flex circuit configured to maintain the desired shape, according to some embodiments.
Figure 9D:
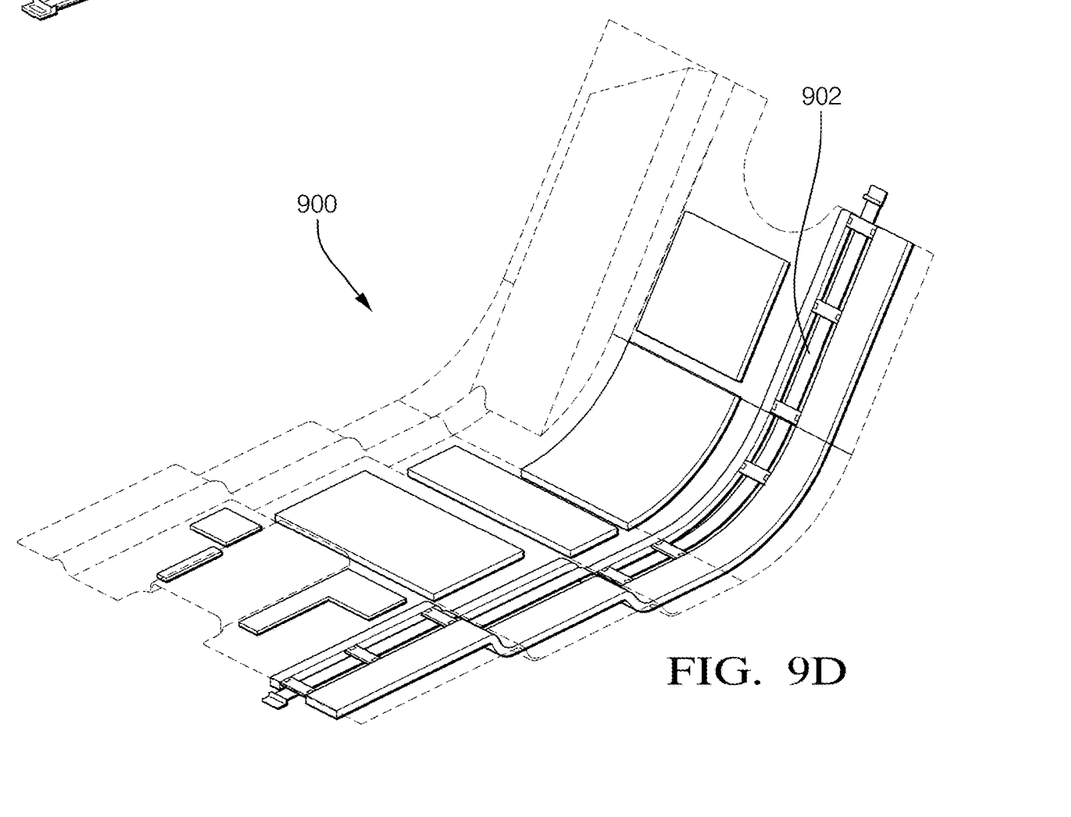
FIG. 9D illustrates an isometric view of the shaped flex circuit of FIG. 9C integrated within an assembly, according to some embodiments.

FIGS. 9A-9D illustrate an exemplary flexible flat cable 902, according to some embodiments. The flexible flat cable 902 may include a flexible plastic substrate surface (e.g., polyimide, polyether ether ketone, polyethylene terephthalate, or other transparent conductive polyester film). The flexible flat cable 902 may be positioned on a shaper 924 having a surface defining a desired shape, as illustrated in FIG. 9B. A nozzle 910 may dispense an extruded material 904 onto the flexible flat cable 902. In some embodiments, the extruded material 904 may be aerosolized as it leaves the nozzle 910. The nozzle 910 may distribute the extruded material 904 in a pattern, e.g., any of the exemplary patterns illustrated in FIGS. 1-8. The extruded material 904 may be cured while the flexible flat cable 902 is positioned on the shaper 924. The flexible flat cable 902 may be removed from the surface of the shaper 924 and maintain the desired shape, as illustrated in FIG. 9C. The flexible flat cable 902 maintaining the desired shape may be secured to a flex circuit 900. In some embodiments, the flex circuit 900 may define the desired shape.

Figure 10:
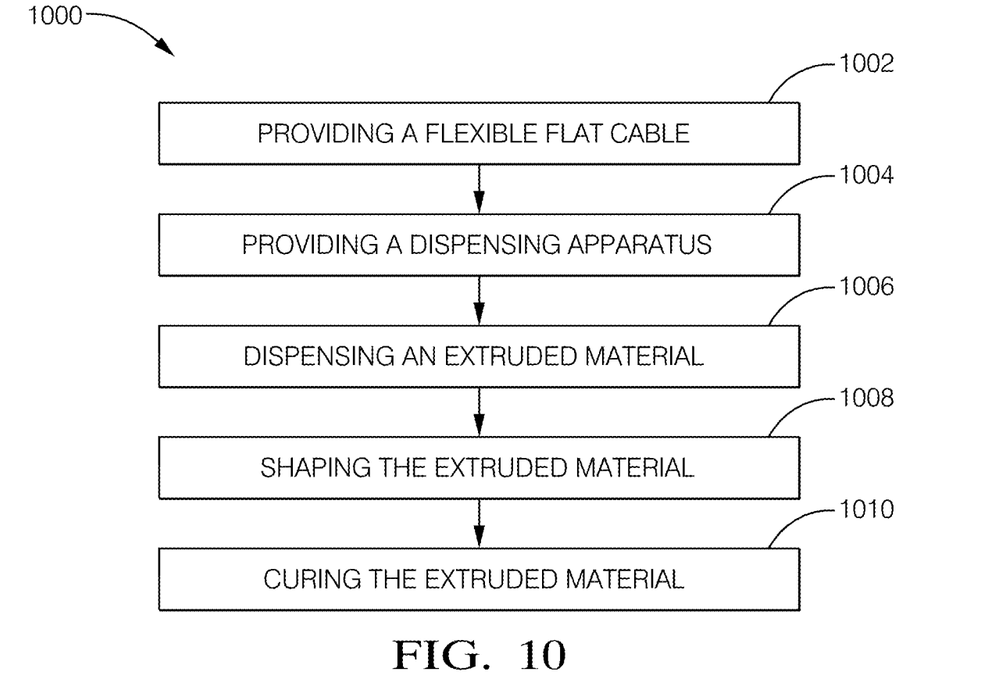
FIG. 10 illustrates a flow chart of an exemplary coating application method, according to some embodiments.

FIG. 10 illustrates a method of forming a flex circuit, according to some embodiments. The method 1000 comprises STEP 1002: PROVIDING A FLEXIBLE FLAT CABLE, which includes providing a flexible flat cable having a first surface and a second surface diametrically opposed to the first surface. The first and second surface of the flexible flat cable may include an engineered plastic or plastic laminate layer. In some embodiments, the flexible flat cable may include one or more conductive layers disposed between the first and second surfaces.

The method 1000 further comprises STEP 1004: PROVIDING A DISPENSING APPARATUS, which includes providing a dispensing apparatus including a nozzle. The dispensing apparatus may include a storage element configured to hold dispensate material. In some embodiments, a CPU or controller may control a position of the nozzle.

The method 1000 further comprises STEP 1006: DISPENSING AN EXTRUDED MATERIAL, which includes dispensing an extruded material through the nozzle of the dispensing apparatus. The extruded material may be dispensed onto the first surface of the flexible flat cable. The extruded material may comprise a urethane acrylate oligomer and a photo-initiator compound having a photopolymerization cure property. In some embodiments, a CPU or controller may control the dispense rate and/or position or the nozzle.

The method 1000 further comprises STEP 1008: SHAPING THE EXTRUDED MATERIAL, which includes shaping the extruded material into a pattern. The pattern may include any of the embodiments illustrated in FIGS. 1-8 (e.g., a serpentine pattern, a cross-hatch pattern, a fill pattern, an uncoated fold region, etc.) and any combination thereof. In some embodiments, the CPU or controller controlling the dispense rate and/or position of the nozzle may form the pattern by selectively dispensing the extruded material into the pattern.

The method 1000 further comprises STEP 1010: CURING THE EXTRUDED MATERIAL, which includes curing the extruded material onto the first surface of the flexible flat cable. In some embodiments, a photopolymerization process may be used. The extruded material may be cured to different levels of rigidity, i.e., the degree to which the extruded material is cured may vary, and thus, the structural properties of the cured extruded material may vary.

In some embodiments, the method 1000 may further comprise providing a controller configured to control a nozzle position and a nozzle dispense rate.

Figure 11:
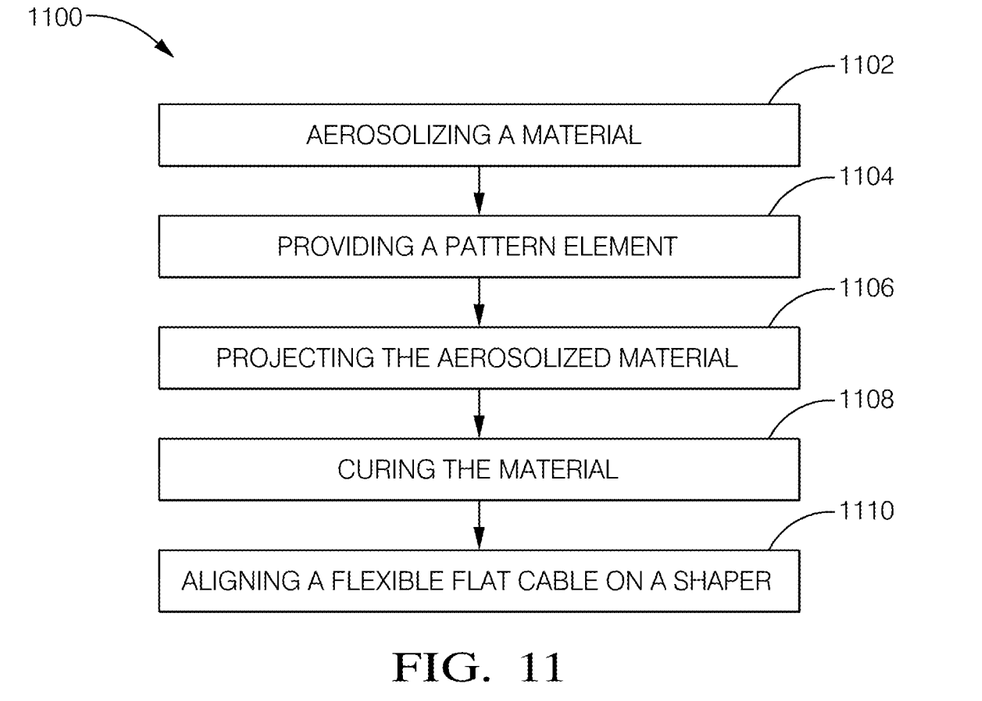
FIG. 11 illustrates a flow chart of an exemplary coating application method, according to some embodiments.

FIG. 11 illustrates a method of providing abrasion resistance to a flex circuit, according to some embodiments. The method 1100 comprises STEP 1102: AEROSOLIZING A MATERIAL, which includes aerosolizing a material comprising a urethane acrylate oligomer and a photo-initiator compound. In other words, the material is colloidally suspended in the air.

The method 1100 further comprises STEP 1104: PROVIDING A PATTERN ELEMENT, which includes providing a pattern element configured to shape the material into a pattern. The pattern may include any of the embodiments illustrated in FIGS. 1-8 (e.g., a serpentine pattern, a cross-hatch pattern, a fill pattern, an uncoated fold region, etc.) and any combination thereof.

The method 1100 further comprises STEP 1106: PROJECTING THE AERSOLIZED MATERIAL, which includes projecting the aerosolized material onto a flex circuit. In some embodiments, the aerosolized material may be projected onto a first surface of a flexible flat cable.

The method 1100 optionally comprises STEP 1108: CURING THE MATERIAL, which includes curing the material on the flex circuit. In some embodiments, the material may be cured via a photopolymerization cure mechanism.

The method 1100 optionally comprises STEP 1110: ALIGNING A FLEXIBLE FLAT CABLE ON A SHAPER, which includes aligning a flex circuit on a shaper having a surface defining a desired shape. In some embodiments, the aerosolized material is projected onto the flexible flat cable aligned on the shaper and the material is cured on the flexible flat cable aligned with the shaper. In some embodiments the flexible circuit maintains the desired shape.

In some embodiments, an electrical flex circuit wiring assembly may be attached to an automotive application in three general configurations. First, a stud mount feature may be used to attach the wiring assembly using discrete component that connects with a threaded stud welded to a vehicle. Second, a hole mount feature may be used to attach the wiring assembly to a discrete component that connects with an interference fit into a hole in a vehicle substrate.

Third, an edge mount feature may be used to attach the wiring assembly using a discrete component to fit on the edge of a vehicle substrate.

In general, the discrete component is fixed onto the wiring assembly using tape, cables, ties, clips and/or snap fit features. Fixing the discrete component onto the wiring assembly may increase manufacturing costs as multiple components must be fixed together and may increase quality assurance costs as the discrete component must be attached in a proper location. Further, additional components may be secured to the discrete component to minimize squeak and rattle.

An extruded material may be selectively applied to a flex circuit at a mount location, i.e., a location wherein an attachment element such as a threaded stud, weld stud, clip, fir tree fastener, etc., secures the flex circuit to a vehicle substrate. The extruded compound may be configured to add stiffness, strength, and/or an engagement surface to the mount location. The extruded compound may be configured to engage with the attachment element. For instance, the attachment element may include threads, grooves, ridges, or projections that engage with the extruded compound and secure the attachment element to the flexible circuit. The engagement surface may be configured to minimize squeak and rattle between the attachment element and the flexible circuit by acting as a cushion. The extruded compound may provide electrical insulation between the flexible circuit and the attachment element.

Figure 12:
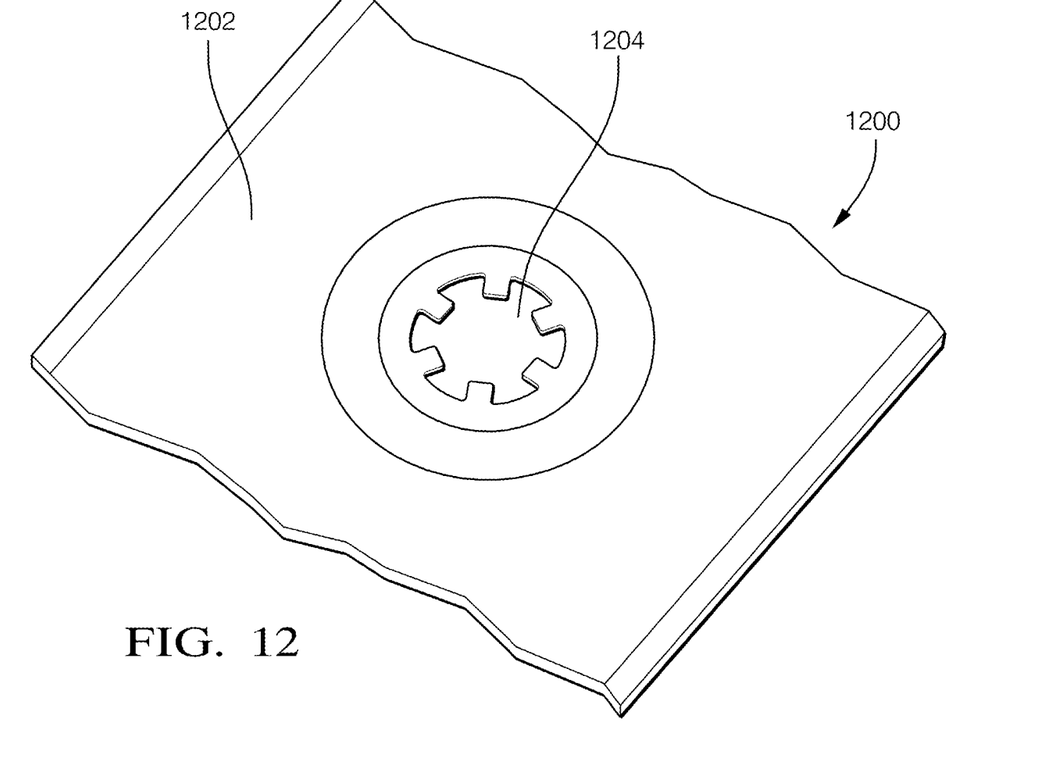
FIG. 12 illustrates an isometric view of a hole mount feature formed in a flex circuit using an additive manufacturing process, according to some embodiments.

FIG. 12 illustrates an isometric view of a flex circuit 1200. The flex circuit 1200 includes a flexible flat cable 1202 having a first surface and a second surface diametrically opposed to the first surface. In some embodiments, the first and second surfaces of the flexible flat cable 1202 may include an engineered plastic or plastic laminate layer and one or more conductive layers positioned between the first and second surfaces. The flex circuit 1200 may include a mount hole 1204 configured to receive a fastener. The mount hole 1204 may define a mount location, i.e., a location on the flex circuit where a mount or fastener is located. The mount hole 1204 may be a through-hole extending through the flex circuit 1200. The fastener may couple or secure the flex circuit 1200 to a substrate.

Figure 13:
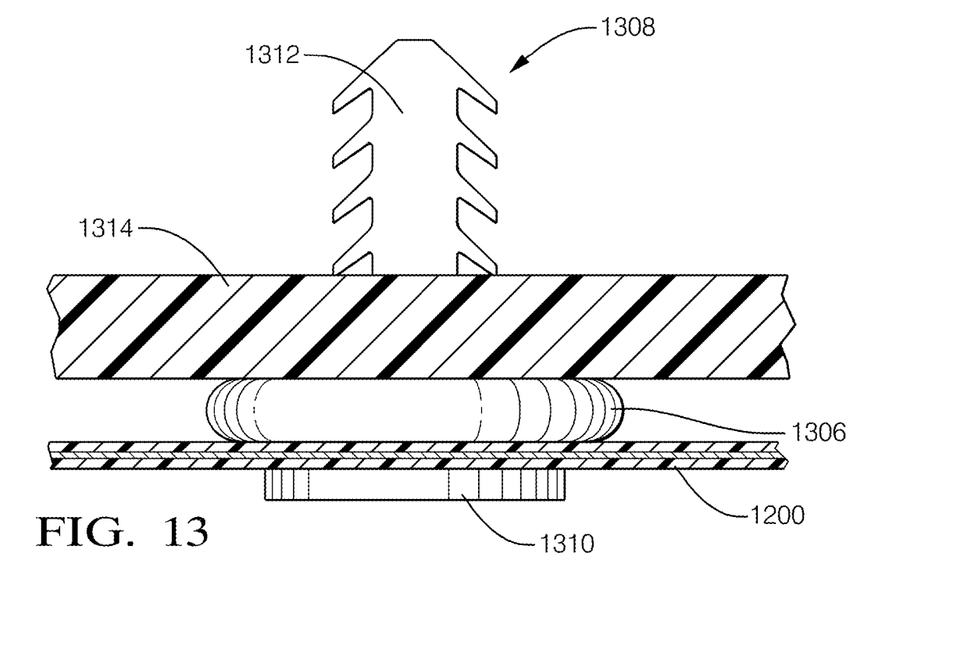
FIG. 13 illustrates a side view of the hole mount feature of FIG. 12 with a fastener received therethrough, according to some embodiments.

FIG. 13 illustrates the flex circuit 1200 coupled to a substrate 1314. A fastener 1308 has a stud portion 1312 and a fastener head 1310. The fastener 1308 extends through the mount hole 1204 and through the substrate 1314. An extruded material 1306 may be bonded to a first surface of the flex circuit 1200, the extruded material 1306 positioned between the flex circuit 1200 and the substrate 1314. The mount hole 1204 and the extruded material 1306 may form a flex circuit attachment feature, i.e., a feature that may receive fasteners or other mounting elements to secure the flex circuit 1200 to the substrate 1314. In some embodiments, the extruded material 1306 may be configured to provide a cushion between the flex circuit and the substrate to prevent wear, friction, and/or minimize squeak and rattle. The extruded material 1306 may be configured to add strength or rigidity to the mount location of the flex circuit.

In some embodiments, the extruded material 1306 may be formed from the chemical class acrylate urethane (including urethane acrylate oligomers) of a moderate to high viscosity and may exhibit thixotropic properties. The viscosity and thixotropy of the extruded material 1306 may be configured to allow for precision dispensing of dimensionally stable structures (e.g., beads, channels, ribs, ridges, etc.). In some embodiments, the extruded material 1306 may include a photo-initiator to enable a photopolymerization cure mechanism. An application of ultraviolet (UV) and/or visible light (VV) may follow the application of the coating to cure (i.e., to catalyze chemical/molecular structures) the extruded material 1306. In some embodiments, the extruded material 1306 may include a fluorescent agent to enable easy identification of the dispensate presence, pattern, and/or cure state. The extruded material 1306 may exhibit ductile properties to flex/bend with the flex circuit, while providing hardness, stiffness, and durability necessary for abrasion resistance and noise abatement. The extruded material 1306 may be configured to bond or adhere with the flex circuit surface, i.e., polyethylene terephthalate (PET), polyethylene naphtholate (PEN), or other engineered plastic laminate layer. The extruded material 1306 may also be bonded or adhered to other support structures, such as a thermoplastic molded channel or ridge to provide a strong interfacial connection.

Figure 14:
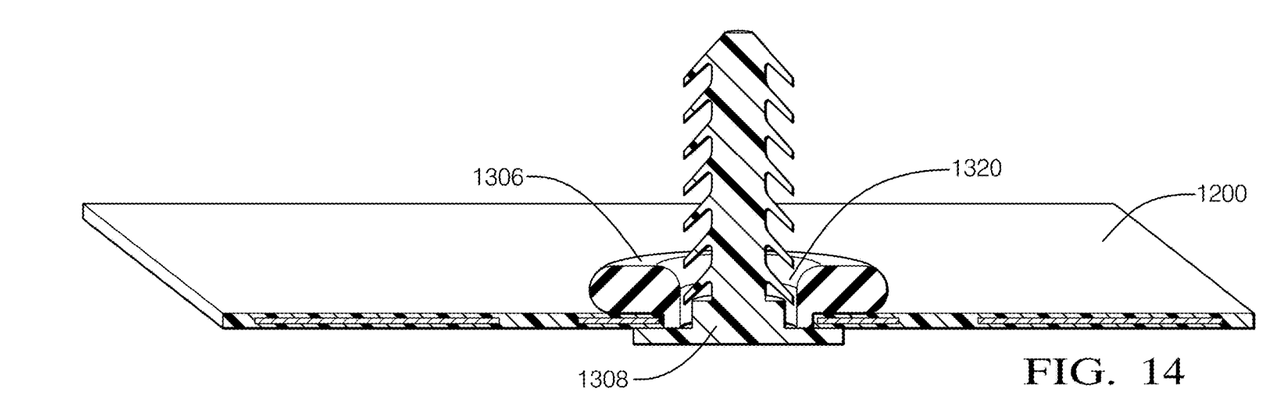
FIG. 14 illustrates a cross-sectional view of the hole mount feature of FIG. 12 with a fastener received therethrough, according to some embodiments.

FIG. 14 illustrates a cross-sectional view of the fastener 1308 of FIG. 13 with the substrate 1314 removed for viewing purposes. The extruded material 1306 may include an engagement surface 1320 configured to engage with the fastener 1308. For instance, the fastener 1308 may include threads or projections that directly contact the engagement surface 1320 of the extruded material 1306.

Figure 15:
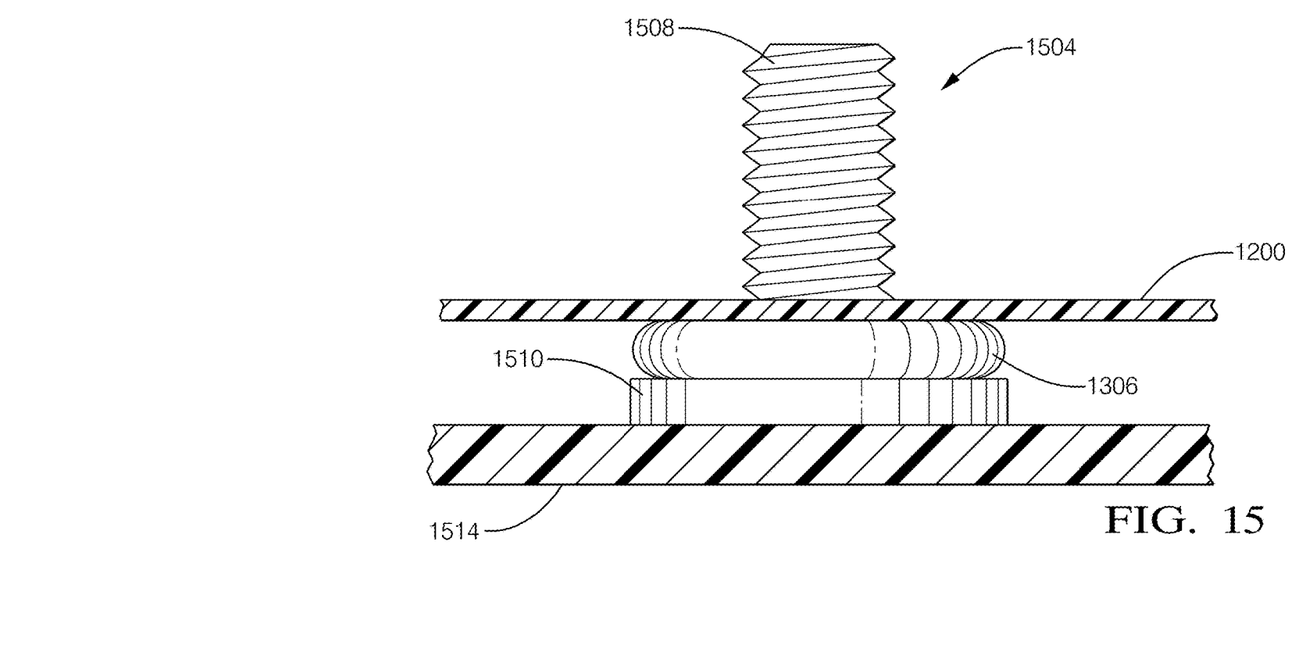
FIG. 15 illustrates an isometric side view of a stud mount feature formed in a flex circuit using an additive manufacturing process, according to some embodiments.

FIG. 15 illustrates the flex circuit 1200 secured to a substrate 1514 via a stud mount 1504. The extruded material 1306 may be disposed between the substrate 1514 and the flex circuit 1200. A fastener 1508 including a threaded stud and a fastener head 1510 secured to the substrate 1514 may extend through the flex circuit 1200. In other words, whereas FIG. 13 illustrated the fastener head 1310 disposed on a first surface of the flex circuit and extending into the substrate 1314, FIG. 15 illustrates the fastener head 1510 disposed on the substrate 1514 and extending through the flex circuit. Thus, the extruded material 1306 may be positioned on the first surface of the flex circuit 1200, the second surface of the flex circuit 1200, or both.

Figure 16:
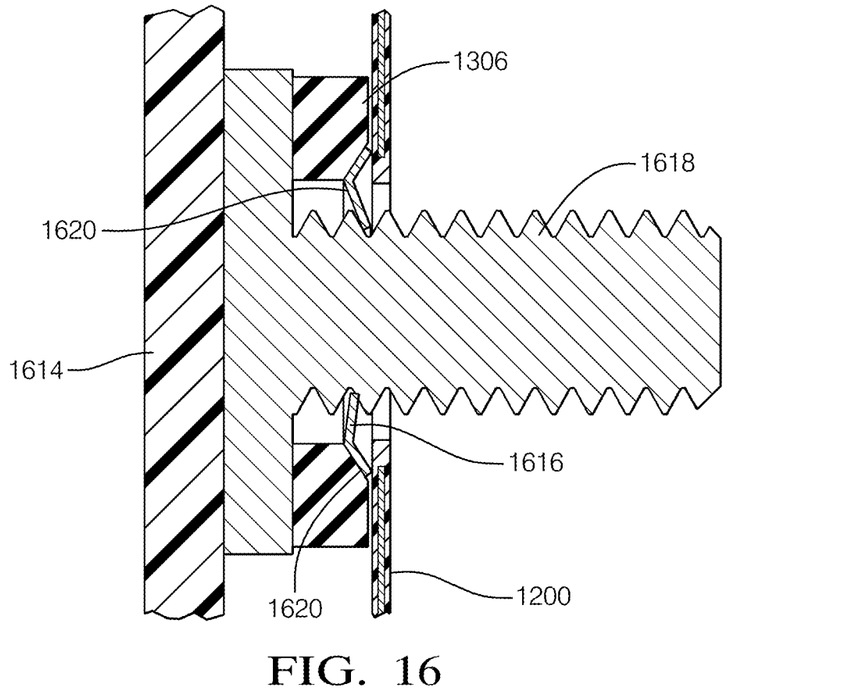
FIG. 16 illustrates a cross-sectional view of a stud mount feature, according to some embodiments.

FIG. 16 illustrates the flex circuit 1200 secured to a substrate 1614 via a stud mount. The stud mount may include a clip 1616 configured to engage with a stud 1618. The extruded material 1306 may be disposed between the substrate 1614 and the flex circuit 1200. In some embodiments, the extruded material may include an engagement surface 1620 configured to engage with the clip 1616 and or the stud 1618.

Figure 17:
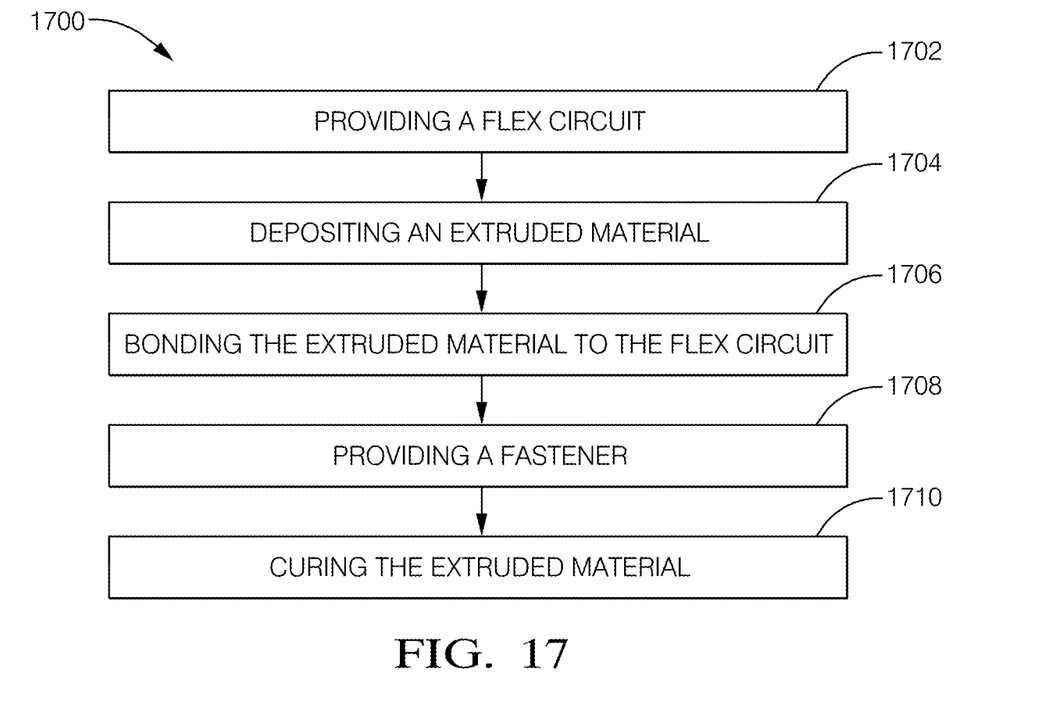
FIG. 17 illustrates a flow chart of an exemplary method of securing a flex circuit to a vehicle substrate, according to some embodiments.

FIG. 17 illustrates a method of securing a flex circuit to a vehicle substrate, according to some embodiments. The method 1700 comprises STEP 1702: PROVIDING A FLEX CIRCUIT, which includes providing a flex circuit having a plastic laminate layer and a first surface diametrically opposed from a second surface. The flex circuit further includes one or more mount locations configured to receive a fastener.

The method 1700 further comprises STEP 1704: DEPOSITING AN EXTRUDED MATERIAL, which includes depositing the extruded material on the first surface of the flex circuit adjacent to the one or more mount locations. The extruded material may be deposited by any of the apparatuses or methods described herein (e.g., FDM, 3D printing, aerosolized spray, digitally controlled methods, etc.). In some embodiments, the extruded material may form an engagement surface.

The method 1700 further comprises STEP 1706: BONDING THE EXTRUDED MATERIAL TO THE FLEX CIRCUIT, which includes bonding the extruded material to the plastic laminate layer of the flex circuit.

The method 1700 further comprises STEP 1708: PROVIDING A FASTENER, which includes providing a fastener at the one or more mount locations. In some embodiments, the fastener may include a fastener head, a stud, and/or a clip. The fastener may be configured to engage with the engagement surface of the extruded material.

The method 1700 optionally includes STEP 1710: CURING THE EXTRUDED MATERIAL, which may include a photopolymerization cure mechanism. In some embodiments, the method 1700 may further include depositing the extruded material on the second surface of the flex circuit. The method 1700 may optionally include providing a controller configured to selectively deposit the extruded material on the flex circuit.

Figure 18:
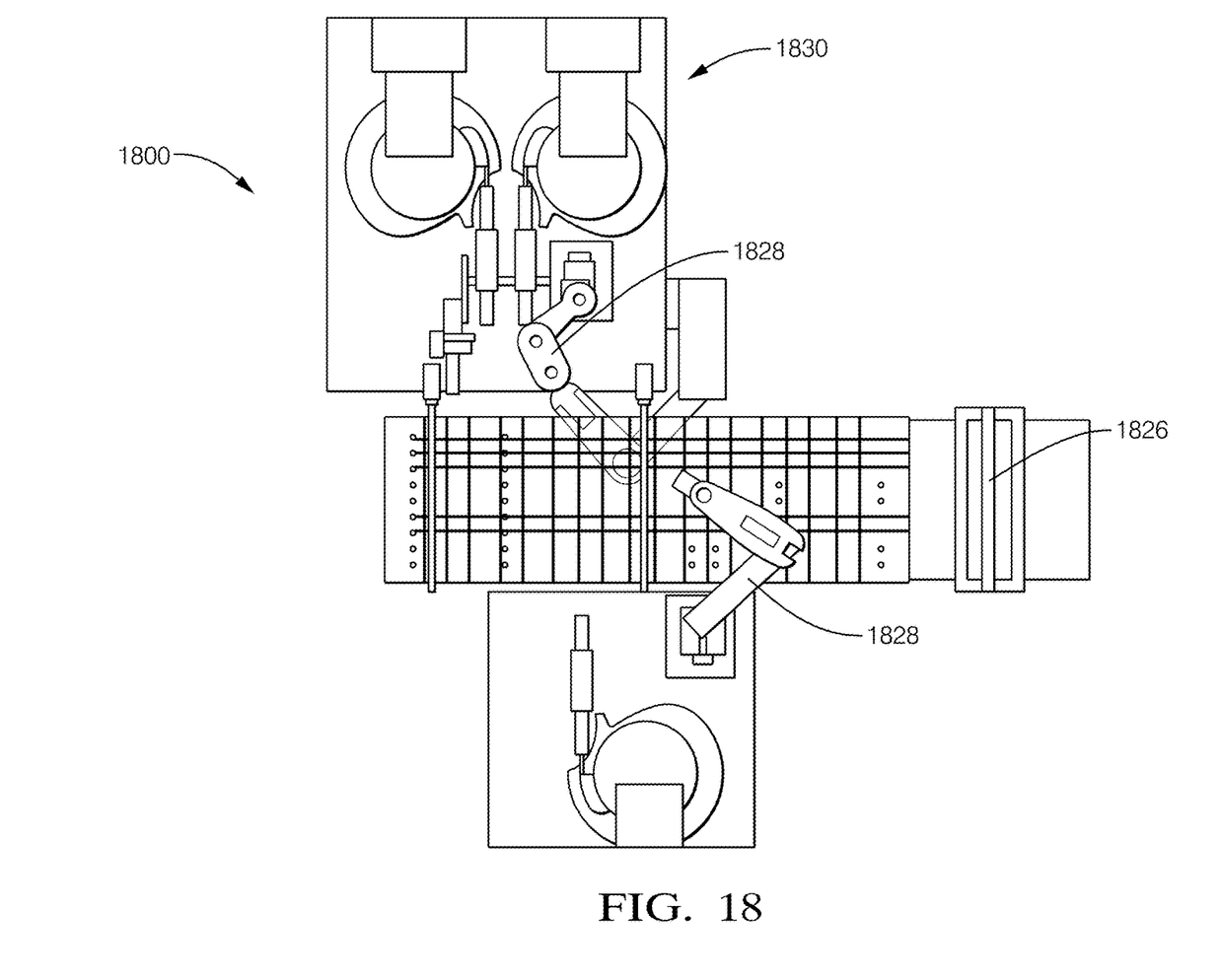
FIG. 18 illustrates a diagrammatic view of an exemplary flex circuit processing line including a coating applicator, according to some embodiments.

FIG. 18 illustrates a diagrammatic view of an exemplary flex circuit processing line 1800. The flex circuit processing line 1800 may include a moving belt 1826 and one or more robotic arms 1828. In some embodiments, a flex circuit may be positioned on the moving belt 1826. The one or more robotic arms 1828 may include a nozzle configured to dispense an extruded material onto the moving belt 1826. In some embodiments, the one or more robotic arms 1828 may include a cure mechanism, e.g., a photopolymerization or heat cure mechanism. The one or more robotic arms 1828 may be controlled by a CPU 1830. The CPU 1830 may control one or more of a robotic arm position, a nozzle dispense rate, and a moving belt speed.

In some embodiments, the flexible circuit processing line 1800 may include a fused disposition modeling ("FDM") or 3D printing process, wherein the coating is pushed through an extruder located in the one or more robotic arms 1828 and deposited on the surface of the flex circuit located on the moving belt 1826. The FDM or 3D printing process may deposit various layers and patterns of the coating on the surface of the flex circuit and may be customized for various flex circuit applications. In some embodiments, the robotic arm 1828 may include a spray-on process, wherein the extruded material is aerosolized and projected onto the surface of the flex circuit. In some embodiments, the robotic arm 1828 may apply the extruded material to the surface of the flex circuit via a direct surface contact.

According to one or more embodiments of the present disclosure, a flex circuit may include a flexible flat cable including a first surface and a second surface, the first surface diametrically opposed from the second surface. An extruded material may be bonded to the first surface of the flexible flat cable, the extruded material distributed in a pattern on the first surface of the flexible flat cable. In some embodiments, the pattern may include a plurality of uncoated regions where none of the extruded material is bonded to the first surface. In some embodiments, the pattern may include one or more uncoated fold regions configured to guide a direction of a fold in the flexible flat cable. In some embodiments, the one or more uncoated fold regions may be perpendicular to a longitudinal axis of the flexible flat cable. In some embodiments, the one or more uncoated fold regions may be oriented in a direction non-orthogonal to a longitudinal axis of the flexible flat cable. In some embodiments, the pattern may include a nested structure configured to form a shape as the flexible flat cable is folded on the uncoated fold region. In some embodiments, the pattern may include one or more serpentine structures configured for abrasion resistance of the flexible flat cable. In some embodiments, the pattern may include one or more cross-hatch structures configured for rigid reinforcement of the flexible flat cable. In some embodiments, the extruded material may comprise a urethane acrylate oligomer and a photo-initiator compound, and the extruded material may be configured to bond to the flexible flat cable via a photopolymerization cure mechanism. In some embodiments, the pattern may be a first pattern and the extruded material may be further distributed in a second pattern on the second surface of the flexible flat cable.

According to one or more embodiments of the present disclosure, a method of forming a flex circuit may include providing a flexible flat cable including a first surface and a second surface, the first surface diametrically opposed to the second surface. The method may further include providing a dispensing apparatus including a nozzle, dispensing an extruded material through the nozzle onto the first surface of the flexible flat cable, shaping the extruded material into a pattern, and curing the extruded material onto the first surface of the flexible flat cable. In some embodiments, the extruded material may comprise a urethane acrylate oligomer and a photo-initiator compound. In some embodiments, curing the extruded material may include a photopolymerization cure mechanism. In some embodiments, the pattern may include a serpentine structure and/or a crosshatch structure. In some embodiments, the pattern may include one or more uncoated fold regions configured to guide a direction of a fold in the flexible flat cable. In some embodiments, the method may further comprise providing a controller configured to control a nozzle position and a nozzle dispense rate.

According to one or more embodiments of the present disclosure, a method of providing abrasion resistance to a flex circuit may include aerosolizing a material comprising a urethane acrylate oligomer and a photo-initiator compound, providing a pattern element, and projecting the material on the flex circuit. The pattern element may be configured to shape the material into a pattern, the material configured to provide an abrasion resistance to the flex circuit. The method may further comprise curing the material on the flex circuit. The method may further comprise aligning a flexible flat cable on a shaper, the shaper having a surface defining a desired shape, wherein the material is projected onto the flexible flat cable aligned on the shaper and the material is cured on the flexible flat cable aligned with the shaper, and wherein the flexible flat cable maintains the desired shape. In some embodiments, the pattern may be configured for at least one of the following selected from a list consisting of abrasion resistance of the flexible flat cable and rigid reinforcement of the flexible flat cable.

According to one or more embodiments of the present disclosure, a wiring assembly may include a flex circuit including a plastic laminate layer and a mount location configured to receive a fastener secured to a substrate. The wiring assembly may include a flex circuit attachment feature including an extruded material bonded to the plastic laminate layer at the mount location. The flex circuit attachment feature may provide a structural strength at the mount location and provides a cushion between the flex circuit and the substrate. In some embodiments the mount location may include a through-hole and the extruded material may form a perimeter around the through-hole. In some embodiments, the flex circuit attachment feature may include an engagement surface configured to be in direct contact with the fastener. In some embodiments the extruded material may comprise a urethane acrylate oligomer. In some embodiments, the extruded material may further comprise a photo-initiator compound configured to provide a photopolymerization cure mechanism. In some embodiments, the fastener includes a threaded stud secured to the substrate. In some embodiments, the fastener may include a stud configured to be inserted into the substrate via an interference fit. In some embodiments, the fastener may include a fir tree fastener and wherein the extruded material is configured to engage with the fir tree fastener. In some embodiments, the fastener may be configured to secure to an edge of the substrate.

According to one or more embodiments of the present disclosure, a method of securing a flex circuit to a vehicle substrate may include providing the flex circuit including a plastic laminate layer, a first surface diametrically opposed to a second surface, and one or more mount locations. The method may further comprise depositing an extruded material on the first surface of the flex circuit adjacent to the one or more mount locations, bonding the extruded material to the plastic laminate layer, and providing a fastener at the one or more mount locations. The fastener may be configured to secure the flex circuit to the vehicle substrate. In some embodiments, the method further includes curing the extruded material. Curing the extruded material may include a photopolymerization cure mechanism. In some embodiments, the extruded material may include a urethane acrylate oligomer and a photo-initiator compound. In some embodiments, the extruded material may form an engagement surface wherein the fastener is configured to be in direct contact with the engagement surface. In some embodiments, the extruded material may be configured to space the flex circuit from the vehicle substrate. In some embodiments, the extruded material may be configured to provide a squeak and rattle abatement between the flex circuit and the vehicle substrate. In some embodiments, the extruded material may be configured to provide an additional attachment strength between the flex circuit and the vehicle substrate. In some embodiments, the extruded material may be configured to provide an electrical insulation between the flex circuit and the vehicle substrate. The method may further comprise depositing the extruded material on the second surface of the flex circuit adjacent to the one or more mount locations. In some embodiments, the method may further comprise providing a controller configured to selectively deposit the extruded material on the flex circuit.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any order of arrangement, order of operations, direction or orientation unless stated otherwise.

What is claimed is:

1. A wiring assembly, comprising:
    a flex circuit including a first surface and a second surface with a conductive layer positioned therebetween, and a plastic laminate layer and a mount location configured to receive a fastener secured to a substrate, the mount location including a through-hole; and
    a flex circuit attachment feature, the flex circuit attachment feature including an extruded material bonded to the plastic laminate layer at the mount location, the extruded material forming a perimeter around the through-hole, wherein the flex circuit attachment feature includes an engagement surface configured to be in direct contact with the fastener,
    wherein the flex circuit attachment feature provides a structural strength at the mount location and provides a cushion between the flex circuit and the substrate,
    wherein the fastener includes a stud having a projection that directly contacts the engagement surface of the extruded material.

2. The wiring assembly of claim 1, wherein the extruded material comprises a urethane acrylate oligomer.

3. The wiring assembly of claim 2, wherein the extruded material further comprises a photo-initiator compound configured to provide a photopolymerization cure mechanism.

4. The wiring assembly of claim 1, wherein the fastener includes a threaded stud secured to the substrate.

5. The wiring assembly of claim 1, wherein the stud of the fastener is configured to be inserted into the substrate via an interference fit.

6. The wiring assembly of claim 1, wherein the fastener includes a fir tree fastener and wherein the extruded material is configured to engage with the fir tree fastener.

7. The wiring assembly of claim 1, wherein the fastener is configured to secure to an edge of the substrate.

8. The wiring assembly of claim 1, wherein the through-hole includes one or more tabs extending radially inward from a perimeter of the through-hole.

9. The wiring assembly of claim 1, wherein the extruded material is deposited solely on the first surface of the flex circuit.

10. A method of securing a flex circuit to a vehicle substrate, comprising:
    providing the flex circuit, the flex circuit including a plastic laminate layer, a first surface diametrically opposed to a second surface with a conductive layer positioned therebetween, and one or more mount locations;
    depositing an extruded material on the first surface of the flex circuit adjacent to the one or more mount locations;
    bonding the extruded material to the plastic laminate layer; and
    providing a fastener at the one or more mount locations,
    wherein the fastener is configured to secure the flex circuit to the vehicle substrate,
    wherein the extruded material forms an engagement surface, wherein the fastener is configured to be in direct contact with the engagement surface, and
    wherein the fastener includes a stud having a projection that directly contacts the engagement surface of the extruded material.

11. The method of claim 10 further comprising:
    curing the extruded material.

12. The method of claim 11, wherein curing the extruded material includes a photopolymerization cure mechanism.

13. The method of claim 10, wherein the extruded material includes a urethane acrylate oligomer and a photo-initiator compound.

14. The method of claim 10, wherein the extruded material is configured to space the flex circuit from the vehicle substrate.

15. The method of claim 10, wherein the extruded material is configured to provide a squeak and rattle abatement between the flex circuit and the vehicle substrate.

16. The method of claim 10, wherein the extruded material is configured to provide an additional attachment strength between the flex circuit and the vehicle substrate.

17. The method of claim 10, wherein the extruded material is configured to provide an electrical insulation between the flex circuit and the vehicle substrate.

18. The method of claim 10 further comprising:
    depositing the extruded material on the second surface of the flex circuit adjacent to the one or more mount locations.

19. The method of claim 10 further comprising:
    providing a controller configured to selectively deposit the extruded material on the flex circuit.

* * * * *